United States Patent [19]

Wilson et al.

[11] Patent Number: 4,741,928
[45] Date of Patent: May 3, 1988

[54] METHOD FOR SELECTIVE DEPOSITION OF TUNGSTEN BY CHEMICAL VAPOR DEPOSITION ONTO METAL AND SEMICONDUCTOR SURFACES

[75] Inventors: Ronald H. Wilson, Niskayuna; Robert W. Stoll, Schenectady; Herbert R. Philipp, Scotia, all of N.Y.

[73] Assignee: General Electric Company, Schenectady, N.Y.

[21] Appl. No.: 36,956

[22] Filed: Apr. 10, 1987

Related U.S. Application Data

[63] Continuation-in-part of Ser. No. 813,890, Dec. 27, 1985, abandoned.

[51] Int. Cl.$^4$ .................. C23C 16/06; C23C 16/08
[52] U.S. Cl. .................. 427/250; 427/55; 427/99; 427/124; 427/252; 427/253; 427/255; 427/255.1
[58] Field of Search .............. 427/91, 124, 250, 253, 427/252, 255, 255.1, 319, 55, 99

[56] References Cited

U.S. PATENT DOCUMENTS

| | | | |
|---|---|---|---|
| 1,617,161 | 2/1927 | Koref et al. | 427/253 |
| 2,885,310 | 5/1959 | Olson et al. | 427/253 |
| 3,477,872 | 11/1969 | Amick | 427/253 |
| 3,565,676 | 2/1971 | Holzl | 427/253 |
| 3,687,722 | 8/1972 | Saxena | 427/91 |
| 3,697,342 | 10/1972 | Cuomo | 427/253 |
| 3,697,343 | 10/1972 | Cuomo et al. | 427/253 |
| 3,785,862 | 1/1974 | Grill | 427/91 |
| 3,862,397 | 1/1975 | Anderson et al. | 118/724 |
| 3,911,194 | 10/1975 | Dejachy et al. | 427/253 |
| 4,138,512 | 2/1979 | Glaski | 427/253 |
| 4,349,408 | 7/1982 | Tarng et al. | 427/253 |
| 4,357,365 | 11/1982 | McCarty | 427/253 |
| 4,404,235 | 9/1983 | Tarng et al. | 427/253 |
| 4,517,225 | 5/1985 | Broadbent | 427/91 |
| 4,540,607 | 9/1985 | Tsao | 427/253 |
| 4,552,783 | 11/1985 | Stoll et al. | 427/91 |
| 4,584,207 | 4/1986 | Wilson | 427/253 |
| 4,595,608 | 6/1986 | King et al. | 427/253 |
| 4,597,167 | 7/1986 | Moriya et al. | 427/91 |
| 4,605,566 | 8/1986 | Matsui et al. | 427/91 |
| 4,617,087 | 10/1986 | Iyer et al. | 427/91 |
| 4,619,840 | 10/1986 | Goldman et al. | 427/91 |
| 4,650,696 | 3/1986 | Raby | 427/91 |
| 4,650,698 | 3/1986 | Moriya et al. | 427/253 |
| 4,653,428 | 3/1987 | Wilson et al. | 118/725 |

FOREIGN PATENT DOCUMENTS 1109473  8/1984  U.S.S.R. .................. 427/91

Primary Examiner—Sadie L. Childs
Attorney, Agent, or Firm—James Magee, Jr.; James C. Davis, Jr.

[57] ABSTRACT

A method and heating apparatus are provided for selectively depositing metal films, such as tungsten, on the metal and semi-conductor surfaces of a silicon wafer by chemical vapor deposition. The method and heating apparatus serve to isolate the depositing surface of silicon wafers from both infrared radiation and the nucleating species which are vaporized by hot surfaces within the reaction chamber by means of a barrier which reflects or absorbs infrared radiation and condenses vaporized nucleating species before a nucleate metal deposition sites on metal or semiconductor surfaces.

6 Claims, 2 Drawing Sheets

METHOD FOR SELECTIVE DEPOSITION OF TUNGSTEN BY CHEMICAL VAPOR DEPOSITION ONTO METAL AND SEMICONDUCTOR SURFACES

This application is a continuation-in-part of copending application Ser. No. 813,890, filed Dec. 27, 1985, now abandoned.

BACKGROUND OF THE INVENTION

The present invention relates generally to a method and apparatus for heating a substrate within a chemical vapor deposition (CVD) reaction chamber. More particularly, it relates to a heating apparatus for CVD reaction chambers and a method for use which permits selective formation of metal films on metal and semiconductor surfaces of a substrate, such as a patterned silicon wafer.

There is a continuous trend in the development of solid state circuitry to reduce the dimensions of devices in integrated circuits and in this way increase the speed of operation and density of the circuitry. As the dimensions of devices on silicon wafers continues to shrink, there is a need to increase the number of layers of conducting lines to interconnect the devices in the circuit. The conducting paths between these layers must be small and consequently become very difficult to fill. An improved method for filling these openings with conductors is needed.

A solution to this problem would be to deposit a metal layer selectively on the conductor and semiconductor surfaces by chemical vapor deposition without deposition on the insulating surface. However, to deposit thick films of metals one must use a reducing atmosphere and selectivity is often lost. For example, to obtain tungsten films thicker than about 500 Angstroms, it is necessary to react tungsten hexafluoride with hydrogen or some other appropriate reducing gas. Selectivity is lost in such a reaction after about 1000 Angstroms of tungsten growth on the conductor surfaces, as disclosed by Saraswat et al. in *Selective CVD of Tungsten for VLSI Technology*, Stanford University, May 1984. Thicker selective depositions can sometimes be achieved but the deposition rate is quite low.

The heating apparatus and process of this invention provide enhanced selectivity of metal deposition at high deposition rates by isolating the depositing surfaces of a substrate from both infrared radiation and nucleating species which are vaporized during the deposition process.

SUMMARY OF THE INVENTION

The apparatus of this invention comprises a hot surface which heats a substrate above 200° C. by heat transfer to the non-depositing surfaces of said substrate. This apparatus incorporates a means for isolating the depositing surfaces of said substrate from impinging infrared radiation and nucleating species vaporized from the hot surface.

The method of this invention selectively deposits tungsten on metal and semiconductor surfaces of a substrate.

This method comprises heating a substrate above 200° C. by heat transfer to the non-depositing surfaces of said substrate while contacting this heated substrate with gaseous reactants that react to form a tungsten film on the depositing surface. The depositing surfaces of the substrate are isolated from both (A) undesirable impinging infrared radiation and (B) a substantial portion of vaporized nucleating species formed during the deposition of tungsten.

The process of this invention is directed to a method for depositing tungsten on semiconductor and metal surfaces. It is based on a chemical vapor deposition process for depositing tungsten characterized by the distinguishing feature of isolating the depositing surface of the substrate from infrared radiation and a substantial portion of vaporized nucleating species generated during the deposition procedure.

OBJECTS OF THE INVENTION

An object of the present invention is to provide a method and apparatus which will deposit tungsten selectively at a thickness above 1000 Angstroms on a patterned substrate containing metal surfaces and/or semiconductor surfaces.

A further object of the invention is to provide a method and apparatus capable of depositing tungsten selectively at rates in excess of 100 Angstroms per minute.

Another object of the present invention is to provide a method and apparatus for heating substrates, such as silicon wafers, within conventional chemical vapor deposition reactors which permit the selective deposition of metal films, such as tungsten.

A further object of the present invention is to deposit tungsten selectively within a CVD reactor utilizing a resistance heater to heat the substrate.

An additional object of the present invention is to provide a means for isolating the depositing surfaces of a substrate from infrared radiation and vaporized nucleating species which is adaptable to many reactor designs.

DETAILED DESCRIPTION OF THE PREFERRED EMBODIMENTS

Figure 1:
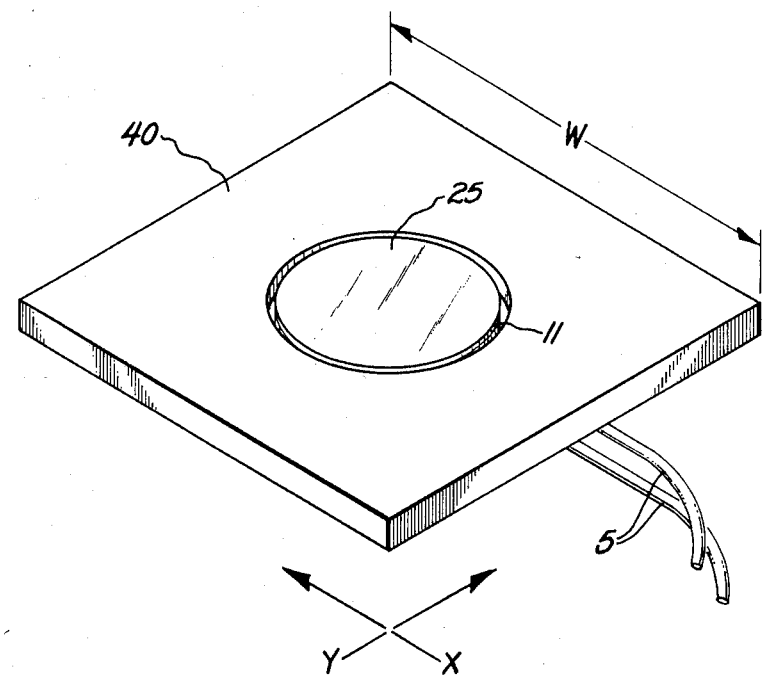
FIG. 1 is a schematic representation of a heating apparatus of this invention which comprises a resistance heater and a plate barrier.

The present invention provides a heating apparatus and a chemical vapor deposition process which enhance the selective deposition of metal films on substrates, such as silicon wafers commonly employed in the electronics industry in the manufacture of integrated circuits, transistors and the like. The term "selective deposition" utilized herein and in the claims refers to deposition on particular materials of a substrate to the exclusion of dissimilar materials on that substrate such as, for example, the deposition on metal and semiconductor surfaces to the exclusion of deposition on insulator surfaces of a substrate. The substrate may be glass, a silicon wafer or other suitable material. The most common are electronic devices having patterned metal and semiconductor surfaces thereon, such as integrated circuits. As used herein, the term "conductive" in connection with a surface on which metal such as tungsten is to be deposited includes both metals and semiconductor material, i.e., any material having metal like conductivity.

The heating apparatus of this invention is suitable for use in conventional chemical vapor deposition reactors with a wide variety of metal and semiconductor containing gases which deposit films on substrates, including metal carbonyls, metal fluorides, silane and germane. The heating apparatus is adaptable to substantially all chemical vapor deposition processes. The process of this invention is directed to the deposition of tungsten films selectively on conductive surfaces with substantially no deposition on nearby insulator or non-conductive surfaces. While in some cases it is desirable to produce a selective film having a thickness in the tens of angstroms, the process and apparatus of this invention can provide films having a thickness above 1 micron.

Several embodiments of the heating apparatus comprising this invention are disclosed herein. Each of such embodiments employs the same basic characteristics, namely the use of a hot surface to heat the substrate and the use of barriers or similar means which isolate the depositing surface of said substrate from undesirable infrared radiation and vaporized nucleating species.

The hot surface of the apparatus transmits heat to the non-depositing surfaces of the substrate to obtain the desired temperature. It is preferable that this hot surface does not heat the depositing surfaces of the substrate directly in that it is inconsistent with isolating this surface from impinging infrared radiation. It is preferable to have the hot surface in close proximity to the non-depositing surfaces of said substrate. This enhances the efficiency of the heating process and provides greater control over the infrared radiation which strays from said hot surface. It may be desirable for the hot surface to contact the non-depositing surfaces. It should be noted that contact between the hot surface and the non-depositing surface is not essential to practice this invention and embodiments which utilize spacers or other means for separating these two elements are within the scope of this invention.

It is preferable to maximize contact between the non-depositing surface and the hot surface so as to enhance the heating efficiency and uniformity. It should be realized, however, the hot surface can be either larger, smaller or equivalent in area to the non-depositing surface. Where a silicon wafer is utilized, it is preferable to have the hot surface conform to the shape of the silicon wafer. For a circular silicon wafer, a hot surface having a diameter either equal to or slightly smaller than, i.e., up to about 1% smaller, is preferred.

The hot surface preferably forms part of a heat source such as a resistance heater or a susceptor coupled with an external radio frequency generator or light source. The susceptor is a solid which is opaque to RF and/or visible radiation. Where opaque to RF radiation, a radio frequency generator heats the susceptor within the reaction chamber by radio frequency induction heating. The radio frequency energy used may have a frequency in the order of 5 KHz to 500 KHz. The non-depositing surfaces of the substrate are then heated by the susceptor. Where an external light source is utilized with a susceptor opaque to visible light, the susceptor absorbs the visible light radiation and heats the substrate. The susceptors for radio frequency energy and visible light energy are preferably comprised of graphite.

The resistance heaters which are suitable for use in this invention are those which are known to the art. Resistance wires which heat a nickel or nickel alloy, for example, monel or stainless steel heat blocks are suitable. Customized resistance heaters may be preferred so as to improve the uniformity of heating. It will be recognized by those skilled in the art that the size and type of resistance heater and/or susceptor can be varied widely without departing from the scope of this invention.

The means for isolating the depositing surface of a substrate from impinging infrared radiation and vaporized nucleating species may be a combination of elements or a single element which performs both functions. An element which performs both functions is referred to herein as a "barrier".

A filter and/or reflector disposed within the chemical vapor deposition reaction chamber between the source of infrared radiation and the substrate will serve as the means for isolating infrared radiation. Filters will absorb infrared radiation while reflectors direct such radiation away from the depositing surface. The filter and/or reflector may be comprised of a material which both absorbs and reflects infrared radiation in varying degrees. Filters are preferred since they are often simple to utilize.

Many materials are suitable for filtering infrared radiation, including gases, solvents and liquids. In that infrared isolation must be accomplished within the reaction chamber, solid filters may be preferred. Complex equipment is required to feed and retain a gas or liquid in the reaction chamber since free foreign liquids or gases within the reaction medium cannot be tolerated. Embodiments which utilize solid filters are less complex than those which utilize a liquid or gas filter. The preferred solid materials for infrared filters are inert within the chemical vapor deposition reactor, such as quartz and nickel. Quartz filters/reflectors are most preferred in that the reaction chamber is often comprised of quartz and therefore the material is not foreign to the chemical vapor deposition reaction.

The configuration of the filters and/or reflectors can vary widely. A suitable embodiment is to surround the periphery of the depositing surface with a filter/reflector material which extends a sufficient distance from the periphery to intercept infrared radiation that would otherwise impinge the depositing surface. The filter/reflector material may extend either above, below or along the plane of the depositing surface. Filter/reflector materials which extend in the same direction as the heat transferred from the hot surface to the substrate need only extend a short distance to be effective. For example, where the hot surface is below the substrate, filters/reflectors which extend about $\frac{1}{8}$" above the plane of the depositing surface, i.e., in the direction of heat radiated to the substrate, are suitable. Most preferably, the filter/reflector extends about 1" in this direction. Filter/reflector materials which do not extend in the direction of heat radiation to the substrate must extend a longer distance than $\frac{1}{8}$". For example, when the hot surface is below the substrate, filters/reflectors positioned below or along the plane of the depositing surface preferably extend across the width of the reaction chamber to ensure absorption or reflection of all infrared radiation which will impinge the depositing surface. It should be realized that the position of the hot surface with respect to the substrate can be varied widely and the position of the hot surface affects the necessary length of the filter/reflector. For example, where the hot surface is above the substrate, the filter/reflector need only extend ⅛" below the depositing surface of the substrate.

Where the hot surface extends beyond the edge of the substrate, it is preferable for the filter/reflector material to contact the periphery of the depositing surface. This ensures the infrared radiation emitted by the hot surface will not pass between the filter/reflector material and the substrate. Where the hot surface does not extend beyond the edge of the substrate, the filter/reflector material need not contact the depositing surface. A space between the filter/reflector material and the depositing surface of about 1 millimeter is often preferred.

The vaporized nucleating species are preferably isolated from the depositing surface by the same element or apparatus which filters and/or reflects infrared radiation. As indicated above, such an apparatus is referred to herein as a "barrier". However, a separate apparatus may be used to perform this function, referred to herein as an "absorber". The barrier or absorber must be an inert solid which has a temperature below the temperature of the depositing surface and does not generate nucleating species.

The absorber or barrier must be cooler than the depositing surface so as to condense the vaporized nucleating species thereon. This serves to intercept these nucleating species to prevent contact with the depositing surface. Preferably, the barrier or absorber has a temperature of about 100° C. below that of the depositing surface and most preferably, this temperature has a value below 200° C.

The number of inert materials which will function as an absorber is extensive. Materials which are suitable for use as solid infrared filters and/or reflectors are also suitable absorber materials. Most solid metals are inert in the CVD reactor and are suitable, including nickel; however, quartz is preferred since it is already present within the reactor walls.

The configuration of the absorber can vary widely. In that a barrier also functions as an infrared filter and/or reflector, its configuration will principally be dictated by the need to isolate impinging infrared radiation. The edges of the absorbers and barriers must be in close proximity to the depositing surface, preferably within 1 millimeter. These absorbers and barriers are also in close proximity to the depositing surface. Those infrared filters and/or reflectors which surround the periphery of the depositing surface are well suited for intercepting vaporized nucleating species and are excellent barriers.

As with infrared filters and/or reflectors, the absorber can extend above, below or along the plane of the depositing surface. However, the absorber need not extend as far from the periphery of the depositing surface as an infrared filter and/or absorber. For example, an absorber which extends along the plane of a depositing surface will intercept a majority of the vaporized nucleating species within one inch from the periphery. Therefore, such an absorber need not extend across the width of the reaction chamber.

The existence of the vaporized nucleating species is demonstrated by deposition on the barriers and absorbers utilized. It is believed hot surfaces within the reaction chamber vaporize materials which have formed on them during the CVD reaction. Some, or all, of these vaporized species provide sites for the CVD reaction.

The heating apparatus of this invention is adapted for use in a cold wall reaction chamber. The term "cold wall reaction chamber" as used herein refers to a system wherein only the substrates and/or the surface on which the substrates are placed are heated to the reaction temperature within the reaction chamber. By utilizing a cold wall reactor, the infrared radiation which impinges upon the depositing surface is controlled more easily.

The apparatus and method of this invention are not limited by the configurations or dimensions of the cold wall reaction chamber. Several different types of reactor configurations have evolved to meet specific requirements of chemical vapor deposition. Among those presently utilized are the horizontal, vertical, cylindrical and tubular systems. In the horizontal system, silicon wafers are typically processed lying flat or on a moving belt in a continuous process furnace. The vertical reactor typically employs a vessel, such as a bell jar, in which the wafers are placed on a susceptor disk which rotates continuously for uniform coverage. The tubular and cylindrical reactors are similar to the horizontal system with the wafers being peripherally mounted in a cylindrical system and multitiered carriers being used in the tubular system. The heating apparatus of this invention is suitable for use in any of the above reactor systems.

The heating apparatus of this invention is suitable for depositing metal films and other vapor deposited materials by heat induced chemical reaction, typically a reduction reaction and/or thermopyrolisis of a reacting gas. The apparatus may be used in low pressure systems, where reaction takes place at subatmospheric pressure, and in plasma assisted chemical vapor deposition processes, where lower temperatures are utilized. Alternative uses of the heating apparatus will be apparent to those skilled in the art from the detailed description herein.

Figure 3:
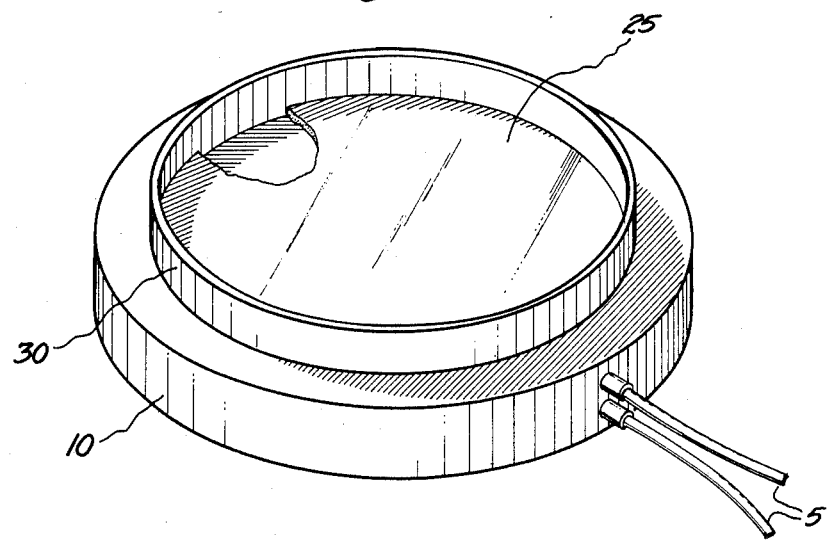
FIG. 3 is a schematic representation of a heating apparatus of this invention which comprises a resistance heater and a quartz ring barrier.
Figure 4:
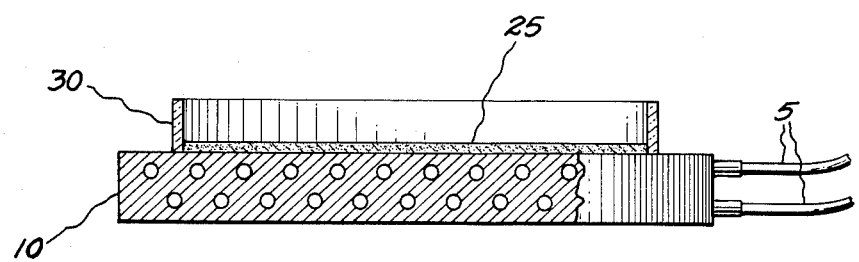
FIG. 4 is a side view of the apparatus shown in FIG. 3.

Referring to the embodiment of the heating apparatus shown in FIGS. 3 and 4, it should be understood that the apparatus shown will be supported within a cold wall chemical vapor deposition reaction chamber. Such support can be provided by any conventional means.

The hot surface is provided by resistance heater 10, with leads 5 connected thereto and extending out of the reaction chamber to a current source. Silicon wafer 25 is supported thereon and is smaller in diameter than the resistance heater 10. The silicon wafer does not form part of this invention but is illustrated to show how the apparatus performs. The means for isolating the depositing surface of the silicon wafer from infrared radiation and the vaporized nucleating species produced by the resistance heater 10 is ring 30. Ring 30 rests on the resistance heater 10, centered about the silicon wafer. The ring contacts the outer periphery of the silicon wafer in the embodiment shown. The resistance heater is in direct contact with the non-depositing surface of the silicon wafer and transfers heat directly thereto.

Figure 2:
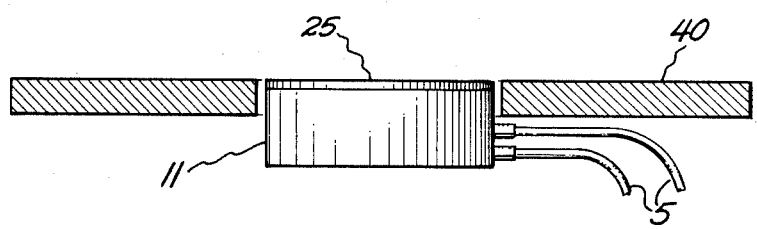
FIG. 2 is a cross-sectional side view of the apparatus shown in FIG. 1.

The embodiment illustrated in FIGS. 1 and 2 is a heating apparatus which utilizes a barrier that extends across the plane of the depositing surface. Resistance heater 11 is similar to that described in FIGS. 3 and 4. It supports silicon wafer 25 and is of an equal diameter to said wafer. Leads 5 provide current to the resistance heater from outside the reaction chamber. The barrier is a plate 40 having an aperture of an inner diameter 2 millimeters longer than the diameter of the silicon wafer. This aperture is positioned over the resistance heater in the plane of the depositing surface (X, Y). The width of the plate, W, is equivalent to the width of the cold wall reaction chamber.

It should be realized that the shape of the plate and ring illustrated can vary widely with the reactor utilized. It should further be realized that a susceptor may be used in place of the resistance heater for these embodiments.

The method of this invention is directed to the deposition of metallic tungsten on various metal and semiconductor surfaces, e.g., the conductive areas on the surface of an integrated circuit element, without deposition of the tungsten on the insulator or non-conductive surfaces, such as the silicon dioxide areas of the element. The method employs a chemical vapor deposition process characterized by the distinguishing feature that the non-depositing surfaces, e.g., the silica surfaces, are isolated from impinging infrared radiation and from vapor phase nucleating species during the deposition procedure.

This method is based on the discovery that vapor phase nucleating species which form on or around the substrate can diffuse to the non-depositing surfaces and initiate the deposition of tungsten thereon. Such nucleating species can be formed, and the diffusion thereof promoted, by infrared radiation, especially low-angle infrared radiation. Accordingly, selective deposition can be achieved by providing a barrier which absorbs or traps the vapor phase nucleating species, thereby isolating the depositing surface from externally generated nucleating species and by simultaneoulsy preventing the formation of on-wafer nucleating species by isolating the depositing surface from infrared radiation.

To obtain films of tungsten, the gaseous reactant is reduced with a reducing atmosphere such as hydrogen. Suitable depositing gases for tungsten include $WF_6$, $W(CO)_6$ and the like. The reduction reaction takes place on the depositing surface at a temperature above about 200° C. The preferred temperature falls within the range of about 350°–650° C. and the total pressure within the reaction chamber is preferably within the range of about 0.1–2 Torr. Heating of the depositing surface is accomplished without appreciable absorption of heat by the reactor walls. The heated substrate is contacted with gaseous reactants that react to form a tungsten film, such as those described above. The preferred gaseous reactants are the combination of tungsten hexafluoride and hydrogen. Preferred mixtures of these constituents provide a hydrogen to tungsten hexafluoride ratio in the range of 1:1 to 3000:1. The throughput rate for such reactions preferably falls within the range of about 0.1–5 liters per minute.

The depositing surface of said substrate is isolated from both impinging infrared radiation and a substantial portion of vaporized nucleating species formed during the deposition of tungsten. This can be accomplished with the filters, reflectors, barriers and absorbers described above. In that certain filters/reflectors need only extend $\frac{1}{8}"$ from the depositing surface, it is inferred that impinging infrared radiation having a low angle of incidence from the plane of said depositing surface, i.e., from about 0° to 45° C., is most critical. However, it is preferable to isolate all of such infrared radiation.

The substrates on which deposition takes place contain metal and semiconductor surfaces. They are most often silicon wafers with an integrated circuit pattern of insulators, metals and semiconductors. The insulator surfaces are typically $SiO_2$ and/or $Si_3N_4$ and the semiconductor surfaces are silicon. The metals can include platinum, molybdenum, titanium, tungsten, tantalum, aluminum and the like. Also included are the silicides of such metals, such as tungsten silicide, molybdenum silicide, tantalum silicide, titanium silicide, platinum silicide and the like, and silicon monoxide.

The most common on-wafer sources of nucleating species are the metallic and semiconductor surfaces themselves. Thus, the silicon surface can provide nucleating species capable of promoting tungsten deposition. The use of silicon as nucleating species can provide a technique for coating extensive areas with tungsten. The expense involved in using pure silicon to promote extensive tungsten deposition can be avoided within the scope of this invention by employing a source of nucleating species as a coating on areas to be metallized. For example, a depositing surface could be made by sputtering or evaporating a thin layer of silicon monoxide onto areas where tungsten deposition is desired, e.g., on an inherently non-depositing surface such as a silica surface. Tungsten and tungsten-free patterns can then be produced by selective removal of unwanted metallization, such as by etching or lift off techniques employing a removal of a sub-layer of photoresist, thus leaving a tungsten pattern over an inherently non-depositing surface.

The following examples are provided to illustrate the particular embodiments of this invention. The examples are not provided with the intention of limiting the scope of this invention to the embodiments disclosed.

EXAMPLE 1

Into a cylindrical, quartz reaction chamber having a width of 6" and a length of about 20" was placed a heating apparatus of this invention. The heating apparatus was as shown in FIGS. 3 and 4. A monel plate having a diameter of 3" functioned as the resistance heater. Two insulated nickel leads provided current to the heating wire through the access door of the reaction chamber. The monel blocks supported a circular silicon wafer having a diameter of 3". The barrier utilized was a quartz ring having a 3" outer diameter, a $\frac{1}{8}"$ thickness and $\frac{1}{4}"$ height. The barrier defined the periphery of the depositing surface. A slidable door in the reactor provided access to the interior of the reaction chamber. The gaseous reactants, tungsten hexafluoride and hydrogen were introduced into the reaction chamber though a pair of conduits that passed through a manifold which sealed off the reactor. The reactor was exhausted at the opposite end of the reaction chamber with the use of a vacuum pump and an absorption trap. A nitrogen backfill was also utilized to prevent impurities from entering the reactor during shutdown.

The substrate utilized was a silicon wafer covered by an insulator surface of silicon dioxide (4000 Angstroms) which was etched for 30 seconds in 1% hydrofluoric acid. The pressure within the reactor was approximately 0.6 Torr and a flow of 300 sccm of hydrogen was maintained during reaction. The heat block was heated from room temperature to 360° C. over a 105 minute period, at which time tungsten hexafluoride was introduced to the system at 10 sccm. After 10 minutes of the tungsten hexafluoride and hydrogen atmosphere, the wafer was cooled and removed from the reactor.

Tungsten was deposited on the outside edge of the wafer but no tungsten deposited on the oxide of the wafer inside the ring. As a comparative example, a similar wafer with the same conditions was heated to room temperature to 360° C. over a 105 minute period without the use of the quartz ring. After heating, tungsten hexafluoride was introduced to the system at 10 sccm per minute. After 5 minutes, the wafer was coated with a non-selective layer of tungsten over the entire oxide surface.

EXAMPLE 2

The same cold wall reactor and heating apparatus as used in Example 1 was utilized in this example. A 3" silicon wafer having a molybdenum layer with 16,000 Angstroms of silicon dioxide deposited thereon was utilized. Vias were etched in the silicon dioxide down to the molybdenum surface. This wafer was placed on a secondary wafer having a 4000 Angstroms low pressure chemical vapor deposition oxide (LPCVD) deposited thereon. This secondary wafer isolated the bare silicon back of the top wafer from the heated block. The same quartz ring as utilized in Example 1 was centered on top of the wafer. The running conditions were identical to that of Example 1 and the wafer was exposed to tungsten hexafluoride and hydrogen for 8 minutes. Deposition was selective with 8000 Angstroms of tungsten being deposited in the vias.

EXAMPLE 3

A similar apparatus to that utilized in Example 1 was utilized in this example. A similar wafer as that utilized in Example 2 was placed on a secondary silicon wafer which served to isolate the wafer from the heated block. The same quartz ring as that utilized in Examples 1 and 2 was utilized in this example. Process conditions were identical to that of Example 2 except the exposure to tungsten hexafluoride and hydrogen was extended to 15 minutes. This resulted in a selective deposition of tungsten and a thickness of about 15,000 Angstroms within the 16,000 Angstroms deep vias.

As a comparative example, a similar wafer was exposed to tungsten hexafluoride and hydrogen within the same apparatus under the same process conditions for a period of 15 minutes. Deposition of tungsten was found to be non-selective and continuous for about ¼" around the perimeter of the wafer.

EXAMPLE 4

The cold wall reactor of Example 1 was utilized in this example. The heating apparatus of this example was that as shown in FIGS. 3 and 4. The heated block having a diameter of 3" and a quartz ring barrier were also the same as that utilized in Example 1.

The wafer to be treated was a 3" silicon wafer having a molybdenum layer over which was deposited silicon dioxide by plasma enhanced chemical vapor deposition (PECVD). The PECVD silicon dioxide had a thickness of approximately 22,000 Angstroms. Vias were etched into this silicon dioxide layer of about 22,000 Angstroms, which exposed the molybdenum layer.

The pressure within the reactor was approximately 0.6 Torr with a flowing atmosphere of hydrogen at a rate of 300 sccm during the reaction. The ring was centered around the outer periphery of the primary silicon wafer with the etched vias. The block was heated from room temperature to 425° C. at the time the tungsten hexafluoride was introduced. The wafer was exposed to hydrogen and tungsten hexafluoride for 15 minutes, resulting in the selective deposition of 21,500 Angstroms of tungsten within the 22,000 Angstroms deep vias.

EXAMPLE 5

A similar cold wall reaction chamber as that described in Example 1 was utilized in this example. The heating apparatus of this example was that illustrated in FIGS. 1 and 2. A heated block having a diameter of 3" was utilized to provide the hot surface. Insulated conducting leads provided the necessary current to the heating wire attached to the monel block via the manifold of the reactor. The barrier utilized in this example extended across the plane of the depositing surface and comprised a nickel plate having a 6" width, 6" length and a 0.02" thickness. The nickel plate had an aperture of 3" which was centrally disposed over the heated monel block. The nickel plate extended to within 1 millimeter of the edge of said silicon wafer.

The substrate utilized was a 3" silicon wafer having 4000 Angstroms of low pressure chemical vapor deposition silicon dioxide deposited thereon. The wafer was circular in configuration and had a diameter equal to the diameter of the heated block. The wafer was placed on the heating block and the reaction chamber evacuated to 0.6 Torr with a flowing atmosphere of hydrogen of about 300 sccm. The block was heated from room temperature to about 400° C. over a 100 minute period, at which time tungsten hexafluoride was introduced to the system at a rate of 10 sccm. After 10 minutes of the tungsten hexafluoride/hydrogen atmosphere, the wafer was removed and tungsten deposition was found to be selective. No tungsten deposited on the oxide of the wafer.

EXAMPLE 6

The same chemical vapor deposition reactor of Example 1 was utilized in this example and the reaction conditions and heating apparatus were as described in Example 5. A 3" silicon wafer having a molybdenum layer over which was deposited a 9000 Angstroms thick layer of PECVD silicon dioxide was utilized. The silicon dioxide was etched to expose the underlying molybdenum layer. Upon treating the silicon wafer to the conditions as described in Example 5 for about 15 minutes, a 15,000 Angstroms deposition of tungsten was noted within the vias with no deposition on the silicon dioxide surface.

Although the above examples have shown various embodiments of the present invention, modifications of these embodiments will be obvious to those skilled in the art, including modified configurations of the heating apparatus and barriers. These obvious modifications are considered to be within the scope of this invention.

EXAMPLE 7

A tungsten layer, about 1 micron thick, was deposited on a thin layer of silicon monoxide in the cold wall reactor described in Example 1 in about 8 minutes at a block temperature of about 600° C. The tungsten layer had a sheet resistance of about 0.06 ohms per square.

What is claimed is:

1. A method for effecting selective chemical vapor deposition of tungsten on metal and semiconductor surfaces of a substrate in a cold-wall reactor which comprises heating the depositing surface of the substrate to a temperature above about 200° C. by heat transfer to the non-depositing surface, contacting the depositing surface with gaseous reactants which react to form metallic tungsten and isolating the depositng surface from impinging infrared radiation and vaporized nucleating species by a barrier which filters or refelects infrared radiation maintained at a temperature below the temperature of the depositing surface.

2. The method of claim 1 wherein the barrier is constructed of a material which filters infrared radiation.

3. The method of claim 2 wherein the barrier is constructed of quartz or nickel.

4. The method of claim 2 wherein the barrier isolates the depositing surface from infrared radiation having an angle of incidence of from 0° to 45° from the plane of the depositing surface.

5. The method of claim 1 wherein the gaseous reactants are hydrogen and tungsten hexafluoride, the substrate is a silicon wafer having metal, semiconductor, and insulator surfaces.

6. The method of claim 1 wherein the depositing surface is isolated from impinging infrared radiation by an infrared filter or an infrared reflector and said surface is isolated from vaporized nucleating species by an absorber having a temperature below the temperature of the depositing surface.

* * * * *